United States Patent
Machida

(10) Patent No.: US 7,189,953 B2
(45) Date of Patent: Mar. 13, 2007

(54) SIGNAL PROCESSING CIRCUIT, IMAGE SENSOR IC, AND SIGNAL PROCESSING METHOD

(75) Inventor: Satoshi Machida, Chiba (JP)

(73) Assignee: Seiko Instruments Inc. (JP)

( * ) Notice: Subject to any disclaimer, the term of this patent is extended or adjusted under 35 U.S.C. 154(b) by 150 days.

(21) Appl. No.: 10/784,494

(22) Filed: Feb. 23, 2004

(65) Prior Publication Data
US 2004/0195491 A1    Oct. 7, 2004

(30) Foreign Application Priority Data

| Feb. 26, 2003 | (JP) | ............................. 2003-049573 |
| Feb. 26, 2003 | (JP) | ............................. 2003-049574 |
| May 27, 2003 | (JP) | ............................. 2003-149268 |
| Jan. 30, 2004 | (JP) | ............................. 2004-023097 |

(51) Int. Cl.
*H01L 27/00* (2006.01)

(52) U.S. Cl. .................................... 250/208.1; 348/302

(58) Field of Classification Search ............. 250/208.1; 348/241, 272, 301, 302, 303
See application file for complete search history.

(56) References Cited

U.S. PATENT DOCUMENTS

| 4,652,927 | A | * | 3/1987 | Hashimoto ................. 348/255 |
| 5,841,126 | A | * | 11/1998 | Fossum et al. ........... 250/208.1 |
| 5,949,483 | A | * | 9/1999 | Fossum et al. ............. 348/303 |
| 5,966,172 | A | * | 10/1999 | Tsunai ........................ 348/241 |
| 6,088,057 | A | * | 7/2000 | Hieda ......................... 348/243 |
| 6,320,616 | B1 | * | 11/2001 | Sauer ....................... 250/208.1 |
| 6,580,465 | B1 | * | 6/2003 | Sato ............................ 348/689 |
| 6,587,143 | B1 | * | 7/2003 | Boisvert ..................... 348/241 |
| 2003/0146369 | A1 | * | 8/2003 | Kokubun ................. 250/208.1 |

* cited by examiner

*Primary Examiner*—Georgia Epps
*Assistant Examiner*—Kevin Wyatt
(74) *Attorney, Agent, or Firm*—Adams & Wilks

(57) ABSTRACT

A signal processing circuit has a sample/hold circuit for sampling an input signal comprised of a first signal and a second signal and for holding the first signal. The first signal comprises an optical signal obtained due to storage of electric charges generated due to light incident upon a photoelectric converter, and the second signal comprises a reference signal obtained due to resetting of the photoelectric converter. A subtracter receives an output signal of the sample/hold circuit and the input signal and obtains a difference between the output signal of the sample/hold circuit and the input signal. A voltage clamp circuit clamps a part or all of an output signal from the subtracter.

11 Claims, 12 Drawing Sheets

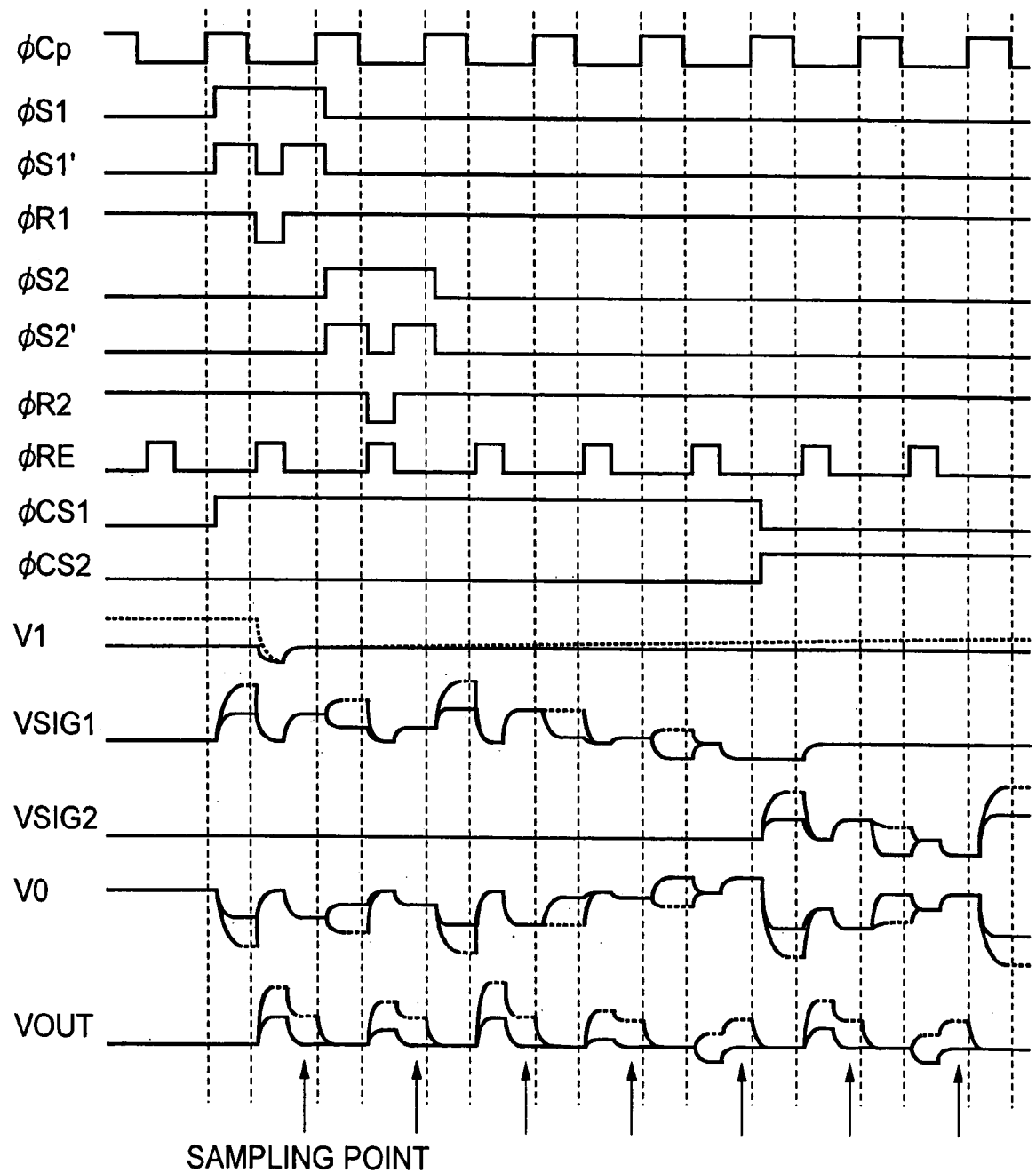

SIGNAL PROCESSING CIRCUIT, IMAGE SENSOR IC, AND SIGNAL PROCESSING METHOD

BACKGROUND OF THE INVENTION

1. Field of the Invention

The present invention relates in general to a signal processing circuit, such as an image sensor, for processing an analog signal. In addition, the invention relates to a linear image sensor and an area image sensor each of which is loaded with the signal processing circuit. Also, the invention relates to a close contact type image sensor having a plurality of linear image sensor ICs mounted thereto.

2. Related Background Art

A circuit diagram of an image sensor of Related Art Example 1 is shown in FIG. 19, and a timing chart of the image sensor of Related Art Example 1 is shown in FIG. 20 (refer to JP 11-112015 A (page 4 and page 5, and FIG. 1) for example).

Related Art example 1 aims at providing a high performance close contact type image sensor which requires no dark correction through removal of an FPN (Fixed Pattern Noise) due to a difference in level among chips.

In accordance with Related Art Example 1, there is provided a close contact type image sensor constituted by a semiconductor device including on the same semiconductor substrate: a sensor module in which a plurality of semiconductor optical chips are mounted on a mounting substrate and each have signal hold circuit for reading out and holding optical signals and noise signals of a plurality of photoelectric converter, common output lines through which the optical signals and the noise signals of the signal hold circuit are outputted, respectively, reset means for resetting the common output lines, respectively, and read means for reading out and outputting the optical signals and the noise signals from the common output lines, respectively; optical signal input buffer means for receiving as its input the noise signals and the optical signals of the sensor chips in the sensor module; differential means for taking a difference between a signal of a noise signal input buffer amplifier and a signal of an optical signal input buffer amplifier; and voltage clamp means for clamping an output signal of the differential means. The close contact type image sensor is characterized in that the voltage clamp means clamps a state in which the optical signal common output lines and the noise signal common output lines are reset.

In addition, an amplifier chip 200 and a sensor chip 100 are constructed using different chips.

In addition, a circuit diagram of an image sensor IC of Related Art Example 2 is shown in FIG. 21, and a timing chart of the image sensor IC of Related Art Example 2 is shown in FIG. 22 (refer to JP 11-239245 A (page 3 and page 4, and FIG. 1) for example).

An N-type region of a photodiode 101 is connected to a positive power supply voltage terminal VDD, and a P-type region of the photodiode 101 is connected to a drain of a reset switch 102 and a gate of a source follower amplifier 103. A reference voltage VREF1 is applied to a source of the reset switch 102. A source as an output terminal of the source follower amplifier 103 is connected to a read switch 105 and a constant current source 104. A constant voltage as a reference voltage VREFA is applied to a gate of the constant current source 104. The number of sets of constituent elements provided within a frame of a photoelectric conversion block An shown in FIG. 8 is identical to the number of pixels, and a read switch 105 of each block is connected to a common signal line 106. Note that the photoelectric conversion block An shows a photoelectric conversion block of an n-th bit.

The common signal line 106 is connected to an inverting input terminal of an operational amplifier 109 through a resistor 110. An output terminal of the operational amplifier 109 is connected to an output terminal 116 through a chip selection switch 112 and a capacitor 113. The common signal line 106 is connected to a signal line reset switch 107, and a reference voltage VREF2 is applied to a source of the signal line reset switch 107. A resistor 111 is connected between an output terminal and the inverting input terminal of the operational amplifier 109, and a voltage appearing at a non-inverting input terminal of the operational amplifier 109 is fixed to a constant voltage VREF3. The operational amplifier 109, the resistor 110, and the resistor 111 constitute an inversion amplifier D.

The output terminal 116 of the image sensor is connected to a drain of a MOS transistor 114, and a reference voltage VREF4 is applied to a source of the MOS transistor 114. In addition, a capacitor 115 including a parasitic capacity or the like is also connected to the output terminal 116 of the image sensor. The capacitor 113, the capacitor 115 and the MOS transistor 114 constitute a voltage clamp circuit C.

However, the image sensor of Related Art Example 1 has a disadvantage that the amplifier chip 200 and the sensor chip 100 need to be provided separately from each other, thereby increasing the number of constituent elements. That is, while the amplifier chip serves to amplify a difference between the reference signal and the optical signal, if amplifiers 201, 202, and 203 are self-contained in the sensor chips, a difference in offset appears among these sensor chips because of offset of the amplifiers 201, 202, and 203, which raises a problem. In addition, there arises a problem in that the circuit of the amplifier chip cannot cope with a sensor chip of such a type as to be adapted to output the reference signal and the optical signal to the same common signal line in order. Moreover, there also arises a problem in that if the image sensor is provided with an amplification function, then an offset of the amplifier is also amplified.

In addition, the image sensor of Related Art Example 2 has a problem in that if a difference between the voltage of VREF3 and the voltage appearing at the terminal 106 is large, then a level of the output signal of the inversion amplifier D is easy to be beyond an output range. That is, the difference between the voltage of VREF3 and the voltage appearing at the terminal 106 is amplified at a magnification factor of a gain of the inversion amplifier D. Thus, if the gain of the inversion amplifier D is large, then a level of the output signal of the inversion amplifier D becomes beyond the output range. In addition, while the offset of the source follower circuit 103 fluctuates every bit, the voltage of VREF3 is constant. Thus, it is difficult to ensure a linear area having broad photoelectric conversion characteristics for outputs of all bits.

Also, in the image sensor of Related Art Example 2, after the optical signal is read out after storage of photocharges, the photodiode is reset, and the reference signal is then read out to take a difference between the optical signal and the reference signal. For this reason, a reset noise contained in the reference signal is different from that contained in the optical signal. That is, there arises a problem in that since the different reset noises of the timings are compared with each other, a random noise becomes large. In particular, the reset voltage VREF1 is normally supplied from a reference voltage circuit provided inside a corresponding one of the image sensor ICs. For this reason, thermal noises are contained in the reset voltage. Normally, the thermal noises can be reduced by a capacitor having a large capacity connected to a reference voltage terminal. However, practically, since a capacitor having a large capacity cannot be provided inside an IC, it is difficult to reduce these thermal noises. For this reason, whenever the reset is carried out, a reset level of the photodiode fluctuates. Consequently, there arises a problem in that a signal level is changed every read line, and hence streaks are formed in a read-out image. In addition, there also arises a problem in that since the reset voltages of the image sensor ICs are different from one another and hence a reverse bias voltage of the photodiode differs every IC, a sensitivity varies among ICs.

SUMMARY OF THE INVENTION

In the light of the foregoing, the present invention has been made in order to solve the above-mentioned problems associated with the related arts. According to one aspect of the present invention, there is provided a signal processing circuit including: a sample/hold circuit for separately receiving as its input an optical signal obtained due to storage of electric charges generated due to light incident upon photoelectric converter, and a signal becoming a reference for the photoelectric converter for a time interval of the first half and for a time interval of the second half to sample these signals for the time interval of the first half and to hold these signals for the time interval of the second half; a subtracter for taking a difference between the sampled and held signal and the inputted signal; and a voltage clamp circuit for receiving as its input a signal from the subtracter, wherein the voltage clamp circuit clamps the signal from the subtracter to a first reference voltage for a part of or all of the time interval of the first half.

In accordance with this signal processing circuit, the same offset voltage is contained in the output signal of the subtracter for the time interval of the first half and the output signal of the subtracter for the time interval of the second half, and the difference between the output signal of the subtracter for the time interval of the first half and the output signal of the subtracter for the time interval of the second half is taken in the voltage clamp circuit. As a result, it is possible to take out a signal in which the offsets of the subtracter having the reference voltage as a reference cancel each other. Consequently, it is possible to obtain a photoelectric converter which is small in fixed pattern noise.

In addition, since the signals inputted to two input terminals of the subtracter, respectively, are obtained by dividing one input signal, it is possible to reduce a difference in level between these signals. Consequently, even if a gain of the subtracter is large, it is possible to widen an effective range of an output signal.

Also, if a plurality of image sensor ICs each having a photoelectric converter and a signal processing circuit formed on one semiconductor substrate are mounted, and reference voltages to be supplied to the respective image sensor ICs are made common, then it is possible to reduce a dark output difference in level, among chips, of output signals of all the image sensor ICs.

Further, according to another aspect of the present invention, there is provided an image sensor IC, including: a photoelectric converter; a signal processing circuit for receiving as its input a signal of the photoelectric converter; a signal output terminal connected to an output terminal of the signal processing circuit; a reference voltage terminal connected to a terminal at which a reference voltage for the signal processing circuit appears; a reference voltage circuit; and a resistor provided between the reference voltage circuit and the reference voltage terminal, the signal processing circuit having: a sampling/holding function for separately receiving as its input an optical signal obtained due to storage of electric charges generated due to light incident upon a photoelectric conversion area of photoelectric converter of the photoelectric converter, and a signal becoming a reference for the photoelectric converter for a time interval of the first half and for a time interval of the second half to sample the inputted signal for the time interval of the first half and to hold the sampled signal for the time interval of the second half; a subtracting function for taking and amplifying a difference between the sampled and held signal and the inputted signal; and a voltage clamping function for clamping the amplified signal for the time interval of the first half, wherein a reference voltage for the voltage clamping function is connected to the reference voltage terminal.

Further, according to another aspect of the present invention, there is provided a close contact type image sensor including a plurality of the image sensor ICs whose reference voltage terminals are electrically connected to one another.

In accordance with this signal processing circuit, the same offset voltage is contained in the output signal of the subtracter for the time interval of the first half and the output signal of the subtracter for the time interval of the second half, and the difference between the output signal of the subtracter for the time interval of the first half and the output signal of the subtracter for the time interval of the second half is taken in the voltage clamp circuit. As a result, it is possible to take out a signal in which the offsets of the subtracter having the reference voltage as a reference cancel each other. Consequently, it is possible to obtain an image sensor IC which is small in fixed pattern noise. Also, a plurality of image sensor ICs are mounted, and reference voltages to be supplied to the respective image sensor ICs are made common, so that it is possible to reduce a dark output difference in level, among chips, of output signals of all the image sensor Ics.

Further, since this reference voltage has an average value of reference voltages generated in reference voltage circuits in the respective image sensor ICs, there is no need to supply a reference voltage from the outside. Therefore, there can be provided a close contact type image sensor having a simple structure and whose pattern noise is small.

In addition, according to another aspect of the present invention, there is provided an image sensor IC including: a plurality of photodiodes serving as a plurality of photoelectric converters; and a plurality of reset switches connected to the plurality of photoelectric converters for initializing the plurality of photoelectric converters, respectively, wherein one terminal of each of the plurality of reset switches are electrically connected to a reference voltage terminal.

In addition, according to another aspect of the present invention, there is provided an image sensor IC self-containing a signal processing circuit for receiving as its input output signals of the plurality of photoelectric conversion units, wherein a terminal at which a reference voltage for the signal processing circuit appears is electrically connected to the reference voltage terminal.

Further, according to another aspect of the present invention, there is provided an image sensor IC further including: a reference voltage circuit built therein; and a resistor provided between the reference voltage circuit and the reference voltage terminal.

Further, according to another aspect of the present invention, there is provided an image sensor including a plurality of image sensor ICs whose reference voltage terminals are electrically connected to one another.

In accordance with this image sensor, since the reset voltages of the photodiodes of all the image sensor ICs become identical to one another, it is possible to reduce a dispersion in sensitivity among the ICs. Also, a capacitor having a large capacity is inserted between the reference voltage terminal made common to the image sensor ICs and the GND terminal or the like to reduce the thermal noises of the reference voltage, whereby it is possible to solve the problem in that steaks are formed in a read-out image.

As described above, according to the present invention, it is possible to obtain the photoelectric converter which is small in fixed pattern noise. Consequently, it is possible to supply the image sensor IC which is simple in configuration and which is small in dispersion of the dark output signals.

In addition, in a case of manufacturing a close contact type image sensor in which a plurality of image sensor ICs described above are linearly mounted, it is possible to reduce a difference in level among chips.

Also, dispersion in sensitivity among ICs can be reduced with a simple configuration. Moreover, it is possible to solve the problem in that streaks are formed in a read-out image.

BRIEF DESCRIPTION OF THE DRAWINGS

In the accompanying drawings:

FIG. 22 is a timing chart of the image sensor of Related Art Example 2.

DETAILED DESCRIPTION OF THE PREFERRED EMBODIMENTS

Preferred embodiments of the present invention will hereinafter be described in detail with reference to the accompanying drawings.

First Embodiment

Figure 1:
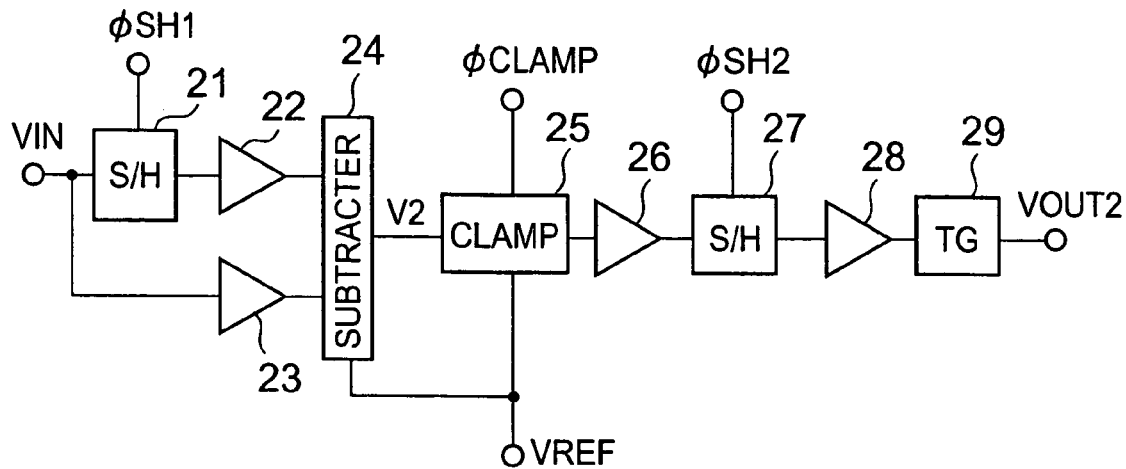
FIG. 1 is a block diagram of a signal processing circuit according to a first embodiment of the present invention.

FIG. 1 is a block diagram of a signal processing circuit according to a first embodiment of the present invention. A signal is inputted to a sample/hold circuit 21 and a buffer amplifier 23 through an input terminal VIN. An output signal of the sample/hold circuit 21 is inputted to a buffer amplifier 22. An output signal of the buffer amplifier 22 and an output signal of the buffer amplifier 23 are inputted to a subtracter 24, an output signal of which is in turn inputted to a voltage clamp circuit 25. A reference voltage for the subtracter 24 and a reference voltage for the voltage clamp circuit 25 can be made common to each other. Then, respective terminals of the subtracter 24 and the voltage clamp circuit 25 are connected to a terminal VREF. An output signal of the voltage clamp circuit 25 is inputted to a buffer amplifier 26. Note that the buffer amplifier 26 may be replaced with an amplification circuit. Moreover, a terminal at which a reference voltage for this amplification circuit appears may be made common to the terminal VREF. An output signal of the buffer amplifier 26 is inputted to a sample/hold circuit 27. An output signal of the sample/hold circuit 27 is inputted to a buffer amplifier 28. An output signal of the buffer amplifier 28 is inputted to a transmission gate 29. An output terminal of the transmission gate 29 is connected to an output terminal VOUT2. Note that the transmission gate 29 is unnecessary depending on applications.

Figure 2:
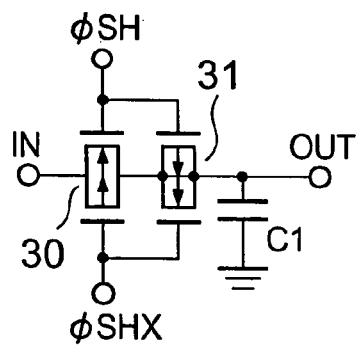
FIG. 2 is a circuit diagram of a sample/hold circuit according to the first embodiment of the present invention.

FIG. 2 is a circuit diagram of a sample/hold circuit according to the first embodiment of the present invention. This sample/hold circuit shown in FIG. 2 can be used as the sample/hold circuit 21 and the sample/hold circuit 27. This sample/hold circuit includes a transmission gate 30, a dummy switch 31, and a capacitor C1. In this sample/hold circuit, in order to cancel a noise of a pulse signal φSH and a noise of a pulse signal φSHX as an inverted pulse signal of the pulse signal φSH with each other, an NMOS and a PMOS of the transmission gate 30 are made identical in transistor size to each other, and a gate area of transistors of an NMOS and a PMOS of the dummy switch 31 is made half a gate area of the transistors of the transmission gate.

Figure 3:
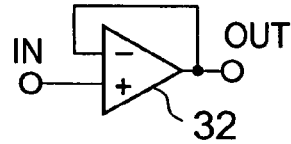
FIG. 3 is a circuit diagram of a buffer circuit according to the first embodiment of the present invention.

FIG. 3 is a circuit diagram of a buffer amplifier according to the first embodiment of the present invention. This buffer amplifier is constituted by an operational amplifier 32. This circuit may be used as each of the buffer amplifiers 22, 23, 26, and 28. Note that the buffer amplifier may be constituted by a source follower amplifier.

Figure 4:
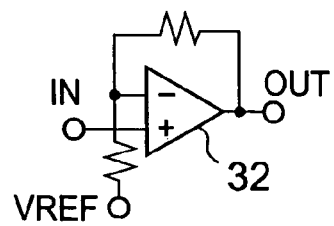
FIG. 4 is a circuit diagram of an amplification circuit according to the first embodiment of the present invention.

FIG. 4 is a circuit diagram of an amplification circuit according to the first embodiment of the present invention. This amplification circuit includes an operational amplifier 32 and a resistor. If this amplification circuit is used instead of the buffer amplifier 26, then it is possible to increase an amplification factor of the signal processing circuit. In addition, a terminal at which a reference voltage VREF for this amplification circuit appears may be made common to the terminal VREF shown in FIG. 1.

Figure 5:
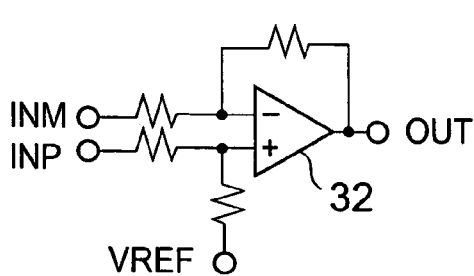
FIG. 5 is a circuit diagram of a subtracter according to the first embodiment of the present invention.

FIG. 5 is a circuit diagram of a subtracter according to the first embodiment of the present invention. This subtracter includes an operational amplifier 32 and a resistor. This subtracter amplifies a voltage which is obtained by subtracting a voltage at an input terminal INM from a voltage at the other input terminal INP gain times, the gain being determined by a ratio of a resistance value of a feedback resistor to a resistance value of an input resistor, to output a resultant signal with a voltage at a terminal VREF as a reference. If the input terminals INP and INM are reversed in position, then an output signal can be inverted with the voltage at the terminal VREF as a reference.

Figure 6:
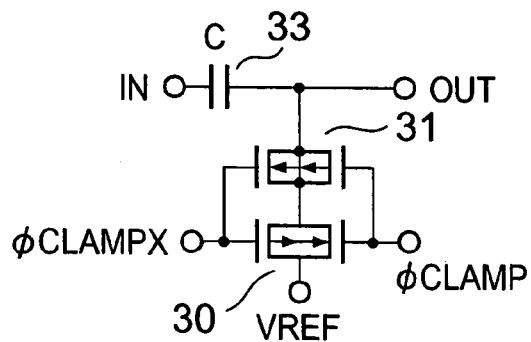
FIG. 6 is a circuit diagram of a voltage clamp circuit according to the first embodiment of the present invention.

FIG. 6 is a circuit diagram of a voltage clamp circuit according to the first embodiment of the present invention. This voltage clamp circuit shown in FIG. 6 can be used as the voltage clamp circuit 25. This voltage clamp circuit includes a transmission gate 30, a dummy switch 31, and a capacitor 33. In this voltage clamp circuit, in order to cancel a noise of a pulse signal φCLAMP and a noise of a pulse signal φCLAMPX as an inverted pulse signal of the pulse signal φSH with each other, an NMOS and a PMOS of the transmission gate 30 are made identical in transistor size to each other, and a gate area of transistors of an NMOS and a PMOS of the dummy switch 31 is made half a gate area of the transistors of the transmission gate.

Figure 7:
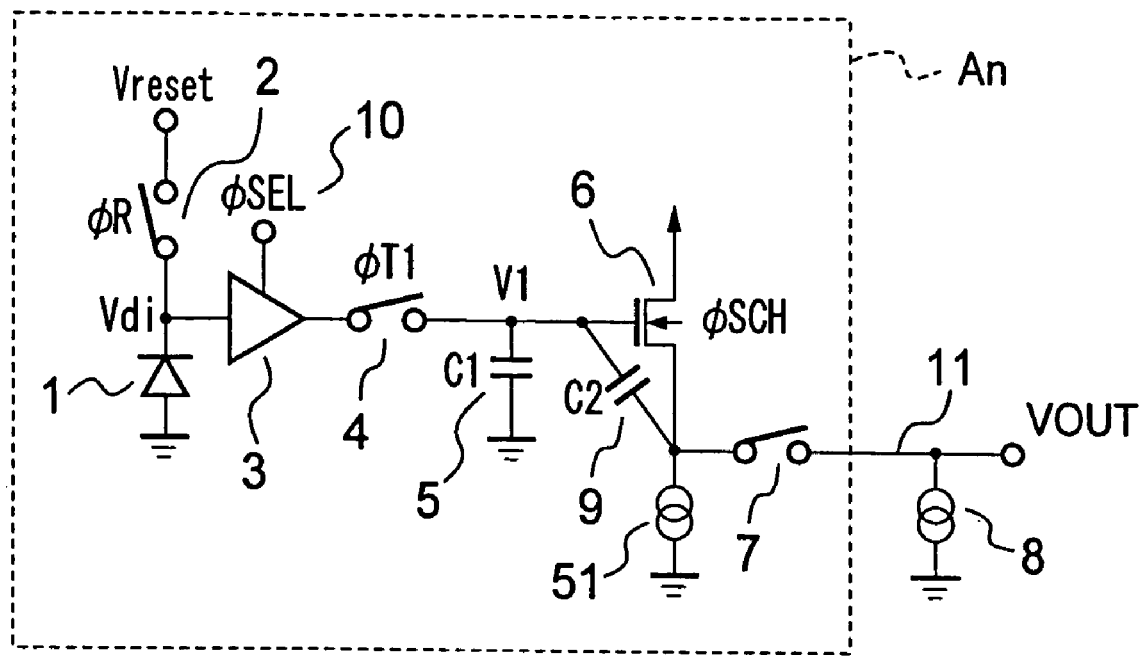
FIG. 7 is a schematic circuit diagram of a photoelectric converter according to the first embodiment of the present invention.
Figure 8:
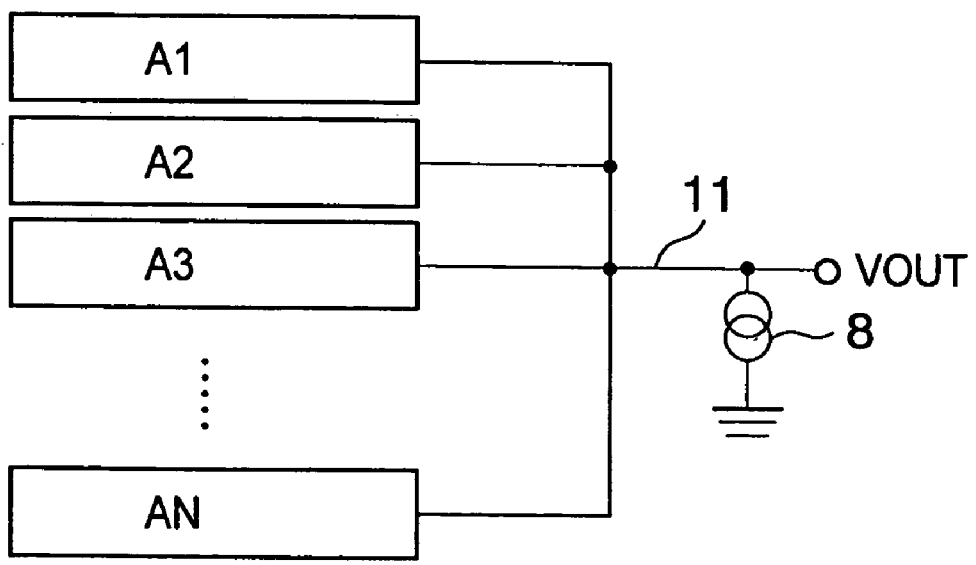
FIG. 8 is a circuit diagram, partly in block diagram, of an entire configuration of the photoelectric converter according to the first embodiment and a second embodiment of the present invention.

FIG. 7 is a schematic circuit diagram of a photoelectric converter according to the first embodiment of the present invention. The number of sets of constituent elements provided inside a frame of a photoelectric conversion block An shown in FIG. 7 is identical to the number of pixels. A channel selection switch 7 of each block is connected to a common signal line 11. Note that the photoelectric conversion block An shows a photoelectric conversion block of an n-th bit. A diagram of a configuration of the whole photoelectric converter according to the first embodiment of the present invention is shown in FIG. 8.

The circuit of the photoelectric conversion block An includes: a photodiode 1 serving as a photoelectric conversion unit; a transfer switch 4 serving as an electric charge transfer unit; a reset switch 2 serving as a reset unit; an amplification unit 3; a capacitor 5; a MOS transistor 6 constituting a MOS source follower; a channel selection switch 7 serving as a channel selection unit; the common signal line 11; and a first current source 8.

The amplification unit 3 may be constituted by a MOS source follower, a voltage follower amplifier, or the like, and may also be provided with an amplifier enable terminal 10 for selection of an operation state. In addition, a parasitic capacity 9 exists between a gate and a source of the MOS transistor 6. Also, a second current source 51 is connected to the source of the MOS transistor 6. This second current source 51 is turned ON and turned OFF in accordance with an enable signal φRR. Then, in a turn-ON state, substantially the same current as that of the first current source 8 is caused to flow through the second current source 51.

An output signal outputted through the output terminal VOUT of this photoelectric converter is inputted to the input terminal VIN of the signal processing circuit of FIG. 1. The photoelectric converter and the signal processing circuit may be formed on one semiconductor substrate.

Figure 9:
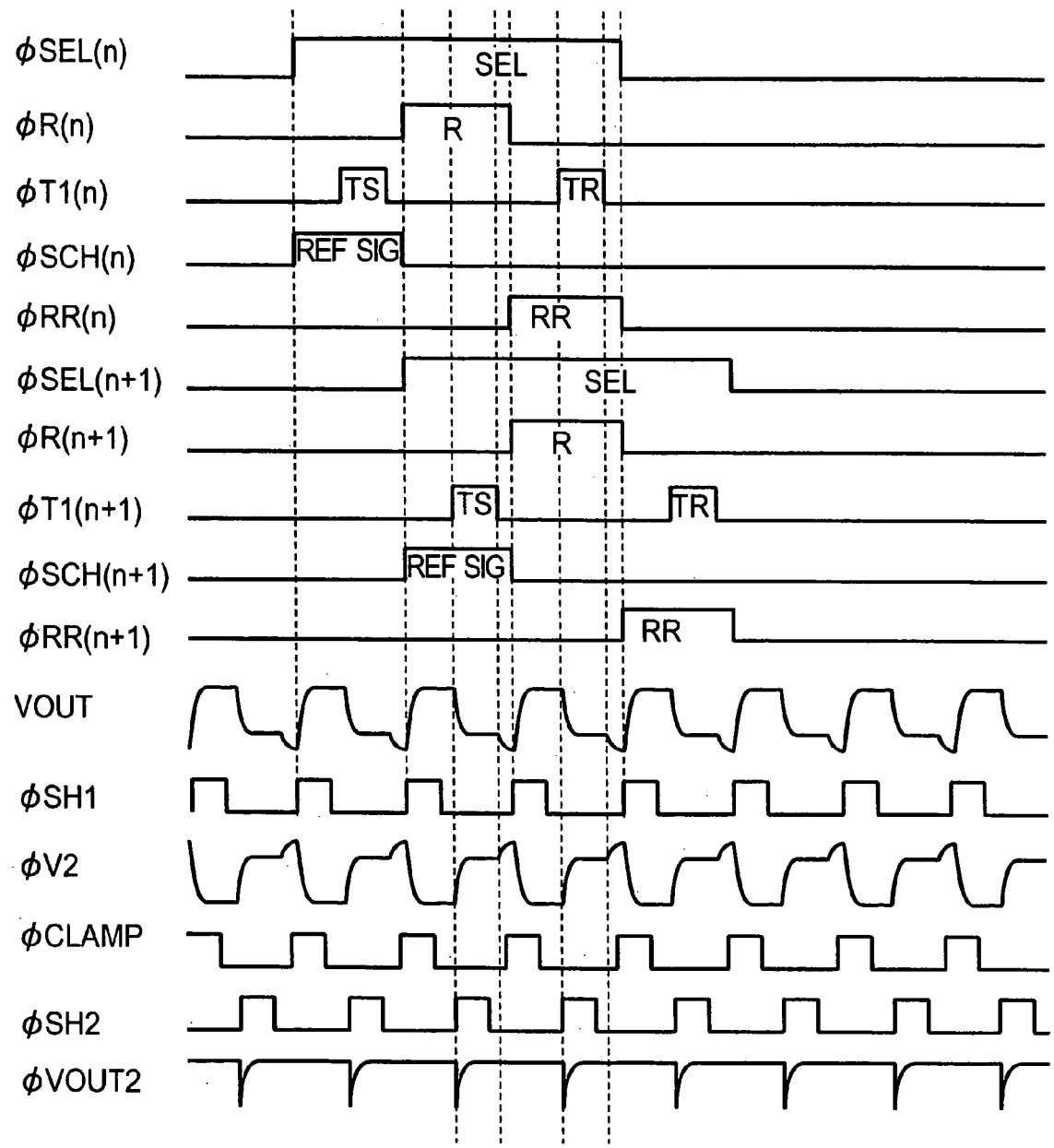
FIG. 9 is a timing chart of the photoelectric converter and the signal processing circuit of the first embodiment of the present invention.

FIG. 9 is a timing chart of the photoelectric converter and the signal processing circuit according to the first embodiment of the present invention. An operation of the first embodiment will hereinafter be described with reference to the timing chart shown in FIG. 9.

First of all, an operation of the photoelectric conversion block of the n-th bit will be described.

At the time when the reset switch 2 is turned ON in accordance with φR(n), a voltage appearing at an output terminal Vdi of the photodiode 1 is fixed to a reference voltage Vreset. On the other hand, at the time when the reset switch 2 is turned OFF, the voltage appearing at the output terminal Vdi takes a value which is obtained by adding an off-noise to the reference voltage Vreset. This off-noise becomes a random noise since an electric potential fluctuates whenever the reset is carried out. Consequently, in order to prevent the random noise from being generated, a difference between the output voltage of the amplifier 3 after the reset, and the output voltage of the amplifier 3 after the subsequent storage of photocharges in the photodiode is taken.

Then, as shown in FIG. 9, after the reset switch 2 is turned OFF in accordance with φR(n), the transfer switch 4 is turned ON in accordance with φT1(n) to read out the reference signal to the capacitor 5 for a time interval TR. At this time, the second current source 51 is turned ON in accordance with an enable signal φRR(n), whereby a source electric potential of the MOS transistor 6 is made substantially the same as that in a read operation while φSCH(n) is held in a turn-ON state. The reference signal is held in the capacitor 5 for one time interval. For this time interval, the photocharges are accumulated in the photodiode 1, and hence the electric potential appearing at the terminal Vdi fluctuates in correspondence to a quantity of photocharges. At the time when the channel selection switch 7 is turned ON in accordance with φSCH(n) of the next time interval, for a time interval REF, the reference signal held in the capacitor 5 is read out to the common signal line 11. Next, at the time when φT1(n) is turned ON to read out an optical signal to the capacitor 5, this optical signal is read out to the common signal line 11. At this time, the second current source 51 is turned OFF. This causes the source electric potential of the MOS transistor 6 when the reference signal is read out to the capacitor 5 for a time interval TR, and the source electric potential of the NOS transistor 6 when the optical signal corresponding to a quantity of electric charges accumulated in the photodiode is read out to the capacitor 5 for a time interval TS to be substantially identical to each other. Consequently, it is possible to reduce an influence of the parasitic capacity 9 on the electric charges accumulated in the capacitor 5. As a result, it is possible to reduce an offset of the dark output voltage.

From the above-mentioned operation, if there is taken a difference between an output voltage VOUT on the common signal line 11 for a time interval REF of φSCH(n), and an output voltage VOUT on the common signal line 11 for a time interval SIG of φSCH(n), then it is possible to remove the fixed pattern noise and the random noise caused by the reset switch 2. Next, after φT1(n) is turned OFF, φSCH(n) is turned OFF, and φR(n) is turned ON to carry out the next reset of the photodiode. Then, φT1(n) is turned ON again to read out the reference signal to the capacitor 5 for the time interval TR.

After φSCH(n) is turned OFF, the channel selection switch 7 of the next bit is turned ON in accordance with φSCH(n+1) to start an operation for reading out a reference signal of the next bit. All other pulses of an (n+1)-th bit are shifted backwardly from the pulses of the n-th bit by a time interval when φSCH is held in a turn-ON state.

In the above description, the second current source 51 may be removed. In this case, the enable pulse signal φRR becomes unnecessary accordingly.

As described above, the reference signal of the n-th bit, the optical signal of the n-th bit, the reference signal of the (n+1)-th bit, and the optical signal of the (n+1)-th bit are outputted in this order through the output terminal VOUT. In the following description, for the sake of convenience, the time interval when the reference signal is outputted is assigned a time interval of the first half, and the time interval when the optical signal is outputted is assigned a time interval of the second half.

Next, an operation of the signal processing circuit will now be described.

An output signal outputted through the output terminal VOUT is inputted to the input terminal VIN. A sample/hold pulse signal φSH1 is turned ON when the reference signal begins to be read-out, and is turned OFF before reading out of the reference signal ends. As a result, the reference signal is sampled and held. The signal at the input terminal VIN and the sampled and held signal are inputted to the subtracter. For the time interval of the first half, the reference signals identical to each other are inputted to the subtracter, and for the time interval of the second half, the reference signal which has been sampled and held and the optical signal are inputted to the subtracter. Thus, an output signal of the subtracter, for the time interval of the first half, is at a level VREF and for the time interval of the second half, is at a level which is obtained by adding the level VREF to a level obtained by amplifying a difference between the reference signal and the optical signal gain times. In addition, offsets of the buffer amplifiers 22 and 23, and the subtracter 24 are contained in the output signal f or the time interval of the first half, and offsets of the buffer amplifiers 22 and 23, and the subtracter 24, and an offset of the sample/hold circuit 21 are contained in the output signal for the time interval of the second half.

A clamp pulse signal φCLAMP is added so as to be turned ON before the sample/hold pulse signal φSH1 is turned ON and to be turned OFF before the sample/hold pulse signal φSH1 is turned OFF. As a result, for the time interval of the first half, an output signal of the voltage clamp circuit 25 is clamped to the level VREF, and for the time interval of the second half, is at a level which is obtained by adding the level VREF to a level obtained by subtracting the output signal of the subtracter for the time interval of the first half from the output signal of the subtracter for the time interval of the second half. As a result, offsets of the buffer amplifiers 22 and 23, and the subtracter 24 are not contained in the output signal of the voltage clamp circuit for the time interval of the second half. In addition, an offset of the sample/hold circuit 21 is small because the circuit is configured such that a noise of the sample/hold pulse signal φSH and a noise of the pulse signal φSHX as an inverted pulse signal of the sample/hold pulse signal φSH cancel each other. From the above, the output signal of the voltage clamp circuit for the time interval of the second half is at a level obtained by adding a level which is obtained by amplifying a difference between the reference signal and the optical signal gain times with the level VREF as a reference.

A sample/hold pulse signal φSH2 is turned ON before and after the optical signal begins to be read-out, and is turned OFF before reading out of the optical signal ends. As a result, the output signal for the time interval of the second half of the clamped output signal is sampled, and is then held for the time interval of the first half of the next bit. Consequently, it is possible to maintain the output level for a long time interval.

Second Embodiment

Figure 10:
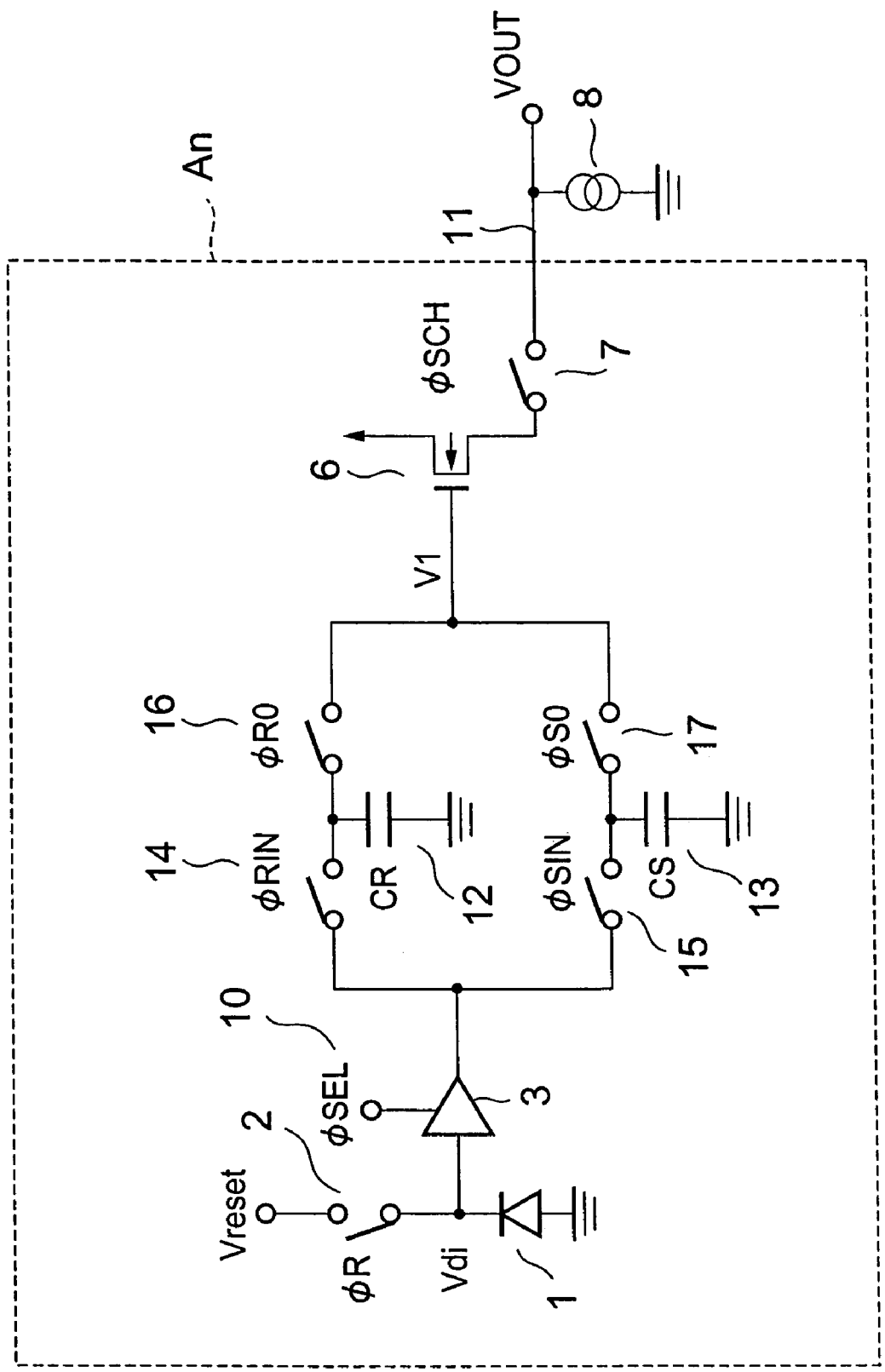
FIG. 10 is a schematic circuit diagram of a photoelectric converter according to a second embodiment of the present invention.

FIG. 10 is a schematic circuit diagram of a photoelectric converter according to a second embodiment of the present invention. The number of sets of constituent elements provided inside a frame of a photoelectric conversion block An shown in FIG. 10 is identical to the number of pixels. A channel selection switch 7 of each block is connected to a common signal line 11. Note that the photoelectric conversion block An shows a photoelectric conversion block of an n-th bit. A diagram of a configuration of the whole photoelectric converter is shown in FIG. 8. The configuration is the same as that in the first embodiment of the present invention.

The circuit of the photoelectric conversion block An includes: a photodiode 1 serving as a photoelectric conversion unit; transfer switches 14, 15, 16, and 17 serving as an electric charge transfer unit; a reset switch 2 serving as a reset unit; an amplification unit 3; a capacitor 13 for holding an optical signal; a capacitor 12 for holding a reference signal that is a reference of the photoelectric conversion unit; a MOS transistor 6 constituting a MOS source follower serving as a signal reading unit; a channel selection switch 7 serving as a channel selection unit; the common signal line 11; and a first current source 8.

The amplification unit 3 may be constituted by a MOS source follower, a voltage follower amplifier, or the like, and may also be provided with an amplifier enable terminal 10 for selection of an operation state.

An output signal outputted through the output terminal VOUT of this photoelectric converter is inputted to the input terminal VIN of the signal processing circuit of FIG. 1. The photoelectric converter and the signal processing circuit may be formed on one semiconductor substrate.

Figure 11:
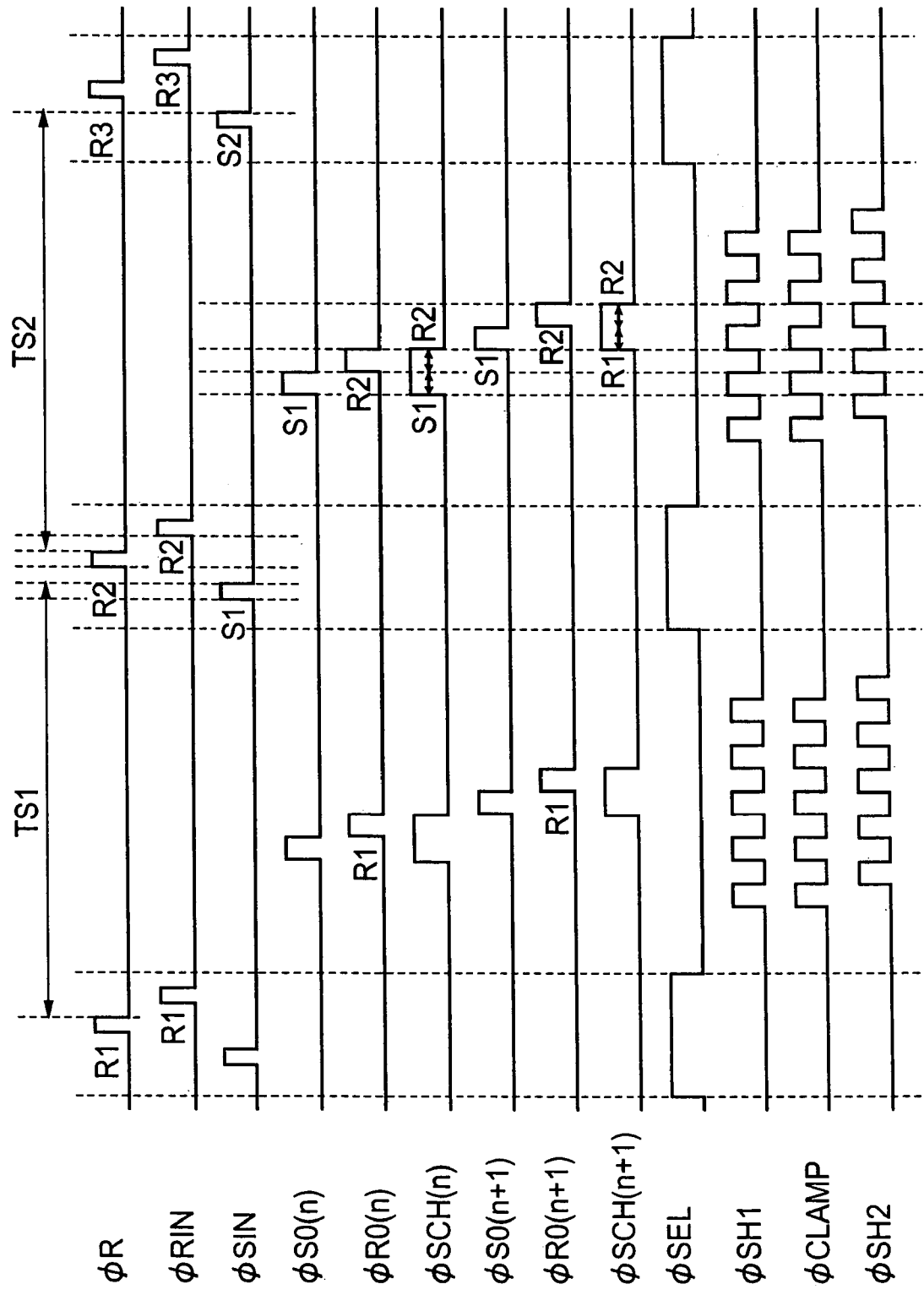
FIG. 11 is a timing chart of the photoelectric converter and a signal processing circuit according to the second embodiment of the present invention.

FIG. 11 is a timing chart of the photoelectric converter 2 and the signal processing circuit according to an example of an embodiment of the present invention.

An operation of the photoelectric converter will hereinafter be described with reference to the timing chart shown in FIG. 11.

φR, φRIN, φSIN, and φSEL of FIG. 11 simultaneously operate for all bits. Since operation timings of φS0, φR0, and φSCH vary depending on bits, φS0, φR0, and φSCH are denoted in the form of addition of "(n)".

First of all, an operation of a photoelectric conversion block of an n-th bit will hereinafter be described. The transfer switch 15 is turned ON in accordance with a pulse SI of φSIN to read out the optical signal obtained by storing electric charges generated due to incidence of light to the photo diode 1 to the capacitor 13. Next, at the time when the reset switch 2 is turned ON in accordance with a pulse R2 of φR, an output voltage appearing at an output terminal Vdi of the photodiode 1 is fixed to a reference voltage Vreset. On the other hand, at the time when the reset switch 2 is turned OFF, the output voltage appearing at the output terminal Vdi takes a value which is obtained by adding an offnoise to the reference voltage Vreset. Next, right after the reset switch 2 is turned OFF, the transfer switch 14 is turned ON in accordance with a pulse R2 of φRIN to read out the reference signal after reset of the photodiode 1 to the capacitor 12. Thereafter, the photocharges are accumulated in the photodiode 1, and hence the electric potential appearing at the output terminal Vdi fluctuates in correspondence to a quantity of photocharges. Since a time interval for the storage ranges from a time point at which reading out of the pulse R2 of φR ends up to a time point at which reading out of the pulse S2 of φSIN of the next time interval ends, this time interval for the storage corresponds to a time interval TS2 shown in FIG. 11. Thus, this time interval for the storage is held for all bits.

Next, an operation for reading out a reference signal and an optical signal will hereinafter be described.

During the time interval TS2 for the storage shown in FIG. 11, if the transfer switch 17 is turned ON in accordance with a pulse of φS0(n), at the same time as the channel selection switch 7 is turned ON in accordance with a pulse of φSCH(n), then an optical signal held in the capacitor 13 is read out to the common signal line 11. This time interval corresponds to a pulse width of the pulse S1 of φSCH(n). This optical signal is a signal accumulated for a time interval TS1. Next, at the time when the transfer switch 16 is turned ON in accordance with a pulse of φR0(n), a reference signal held in the capacitor 12 is read out to the common signal line 11. This reference signal is a signal which is reset in accordance with the pulse R2 of φR.

Next, if a channel selection switch 7 of the next bit is turned ON in accordance with φSCH(n+1), and a transfer switch 17 of the next bit is turned ON in accordance with a pulse of φS0(n+1) after φSCH(n) is turned OFF, then an operation for reading out an optical signal of the next bit is started. All other pulses of an (n+1)-th bit are shifted backwardly from the pulses of the n-th bit by a time interval when φSCH is held in a turn-ON state.

In this embodiment, when the photodiode is in storage operation for a time interval TS2, it is possible to read out the optical signal accumulated for a time interval TS1 for the preceding storage. Consequently, LEDs of three colors R, G, and B can be turned ON in order to read out color image data. For example, for the time interval TS1, the LED of red can be turned ON to read out a red component, for the time interval TS2, the LED of green can be turned ON to read out a green component, and for a time interval following the time interval TS2, the LED of blue can be turned ON to read out a blue component. In this case, within the time interval TS2, the optical signal of red is read out.

As described above, the optical signal of the n-th bit, the reference signal of the n-th bit, the optical signal of the (n+1)-th bit, and the reference signal of the (n+1)-th bit are outputted in this order through the output terminal VOUT of the common signal line 11. Then, the order of the optical signal and the reference signal is reversed from that in the photoelectric converter 1. However, similarly to the photoelectric converter according to the first embodiment of the present invention, a difference between the optical signal and the reference signal can be amplified in the signal processing circuit of FIG. 1 with the level VREF as a reference using the pulse signals φSH1, φCLAMP, and φSH2 shown in FIG. 11.

In the above description, any circuit may be adopted as the photoelectric converter as long as it is adapted to output a reference signal and an optical signal in order. The signal processing can be executed using a linear sensor or an area sensor. In addition, it is possible to cope with the case where the output order of a reference signal and an optical signal is reversed by inversely connecting the input terminals INP and INM of the subtracter. Also, if the input terminals INP and INM of the subtracter are inversely connected, then the level of the output signal of the subtracter is inverted with the level VREF as a reference. Thus, the sensitivity of the signal processing circuit can be made positive irrespective of the sensitivity of the optical signal being positive or negative.

As described above, according to the present invention, the same offset voltage is contained in the output signal of the subtracter for the time interval of the first half, and the output signal of the subtracter for the time interval of the second half, and a difference between the output signal of the subtracter for the time interval of the first half, and the output signal of the subtracter for the time interval of the second half is taken by the voltage clamp circuit. Thus, it is possible to take out a signal in which the offsets of the subtracter cancel each other with the reference voltage as a reference. Consequently, it is possible to obtain the photoelectric converter having merely a small fixed pattern noise. In addition, it is possible to form a linear image sensor IC or an area image sensor IC in which the photoelectric conversion unit and the signal processing circuit are formed on one semiconductor substrate. Also, if a plurality of linear image sensor ICs are mounted, and the reference voltages to be supplied to the respective image sensor ICs are made common to one another, then it is possible to reduce a dark output level difference among the chips, of the output signals of the image sensor ICs. At this time, since the signal processing circuit is provided with the transmission gate 29, the output signals of the image sensor ICs can be read out to the common signal line.

Third Embodiment

Figure 12:
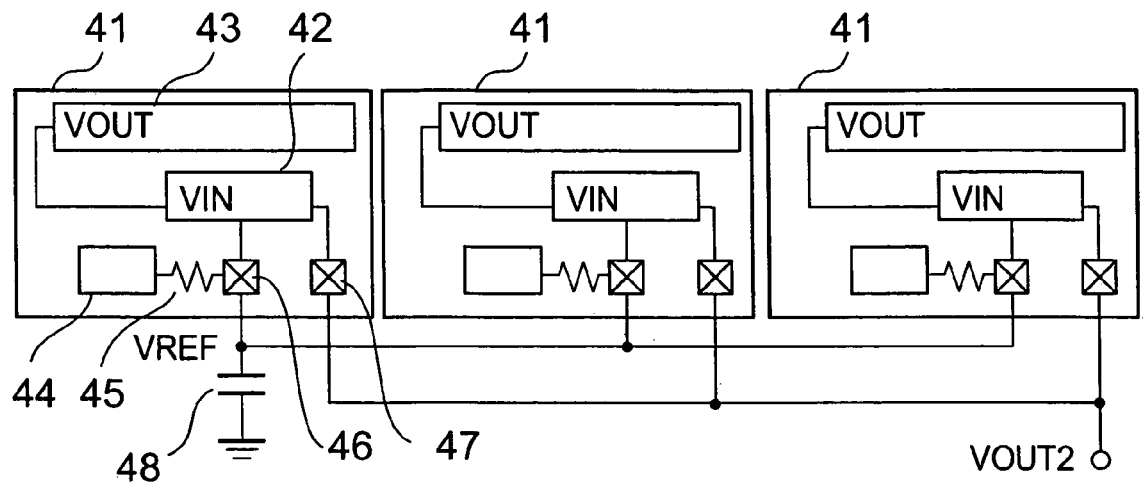
FIG. 12 is a schematic diagram of a close contact type image sensor according to a third embodiment of the present invention.

FIG. 12 is a schematic diagram of a close contact type image sensor according to a third embodiment of the present invention. This close contact type image sensor includes three image sensor ICs 41. Each image sensor IC 41 includes a signal processing circuit 42, a photoelectric converter 43, a reference voltage circuit 44, a resistor 45, a reference voltage terminal 46, and a signal output terminal 47. A common signal line of the photoelectric converter 43 is connected to the signal processing circuit 42, and an output terminal of the signal processing circuit 42 is connected to the signal output terminal 47. In addition, a reference voltage of the signal processing circuit 42 appears at the reference voltage terminal 46, and a resistor 45 is provided between the reference voltage circuit 44 and the reference voltage terminal 46.

The signal output terminals 47 of all the image sensor ICs 41 are connected to one another in the outside, and output signals of all the image sensor ICs 41 are outputted to the outside through an output terminal VOUT2. The reference voltage terminals 46 of all the image sensor ICs 41 are also connected to one another in the outside. If necessary, a capacitor 48 is provided between the reference voltage terminal 46 and GND for stabilization of the reference voltage VREF.

Output voltages of the reference voltage circuits 44 of the respective image sensor ICs 41 vary due to process variation or the like. However, since these reference voltage circuits 44 are short-circuited with one another through the respective resistors 0.45, the electric potential VREF of the capacitor 48 takes a mean value of the output voltages of the reference voltage circuits 44 of the three chips. The voltage VREF is supplied to the signal processing circuits 42 of all the image sensor ICs 41.

Note that the signal processing circuit of FIG. 1 can be used as the signal processing circuit 42, and the photoelectric converter of FIG. 7 or FIG. 10 can be used as the photoelectric converter 43. The operations of the signal processing circuit 42 and the photoelectric converter 43 are as described in the first and second embodiments.

As described above, according to the present invention, the same offset voltage is contained in the output signal of the subtracter for the time interval of the first half, and the output signal of the subtracter for the time interval of the second half, and a difference between the output signal of the subtracter for the time interval of the first half, and the output signal of the subtracter for the time interval of the second half is taken by the voltage clamp circuit. Thus, it is possible to take out a signal in which the offsets of the subtracter cancel each other with the reference voltage as a reference.

The reference voltages to be supplied to the voltage clamp circuit are at the same level with respect to all the image sensor ICs, so that it is possible to reduce a dark output level difference among the chips of the output signals of the image sensor ICs. Consequently, it is possible to obtain the close contact type photoelectric converter having merely a small fixed pattern noise. At this time, since the signal processing circuit is provided with the transmission gate 29, the output signals of the image sensor ICs can be read out to the common signal line.

Fourth Embodiment

Figure 13:
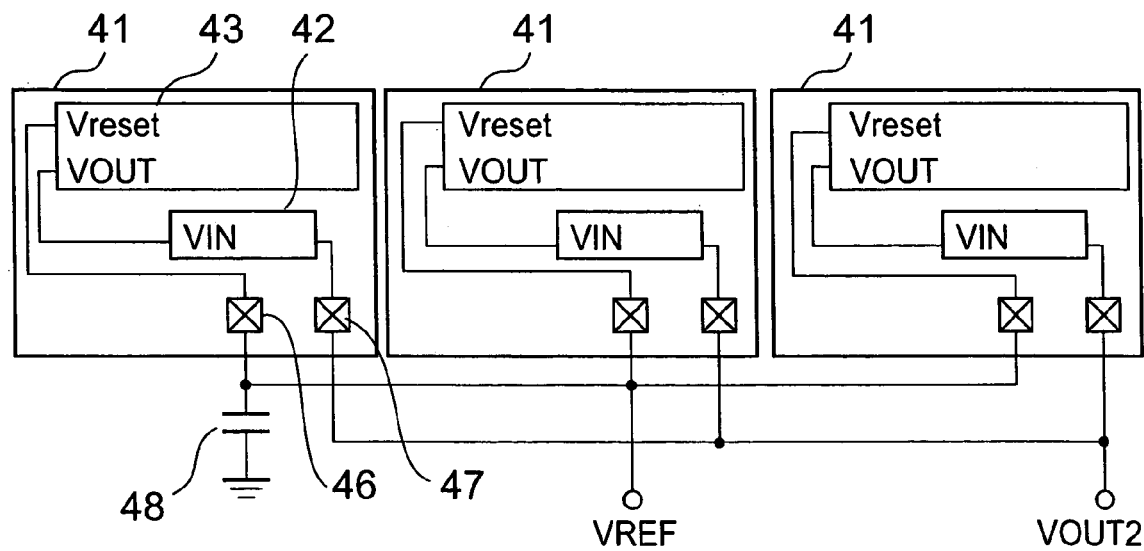
FIG. 13 is a schematic diagram of a close contact type image sensor according to a fourth embodiment of the present invention.

FIG. 13 is a schematic diagram of a close contact type image sensor according to a fourth embodiment of the present invention. This close contact type image sensor includes three image sensor ICs 41. Each image sensor IC 41 includes a signal processing circuit 42, a photoelectric converter 43, a reference voltage terminal 46, and a signal output terminal 47. A common signal line of the photoelectric converter 23 is connected to the signal processing circuit 42, and an output terminal of the signal processing circuit 42 is connected to the signal output terminal 47.

The signal output terminals 47 of all the image sensor ICs 41 are connected to one another in the outside, and output signals of all the image sensor ICs 41 are outputted to the outside through an output terminal VOUT2. The reference voltage terminals 46 of all the image sensor ICs 41 are also connected to one another in the outside. If necessary, a capacitor 48 is provided between the reference voltage terminal 46 and GND for stabilization of the reference voltage VREF. The voltage VREF is supplied to a terminal Vreset of the photoelectric converter 43 of every image sensor IC 41.

The signal processing circuit of FIG. 1 can be used as the signal processing circuit 42.

Figure 14:
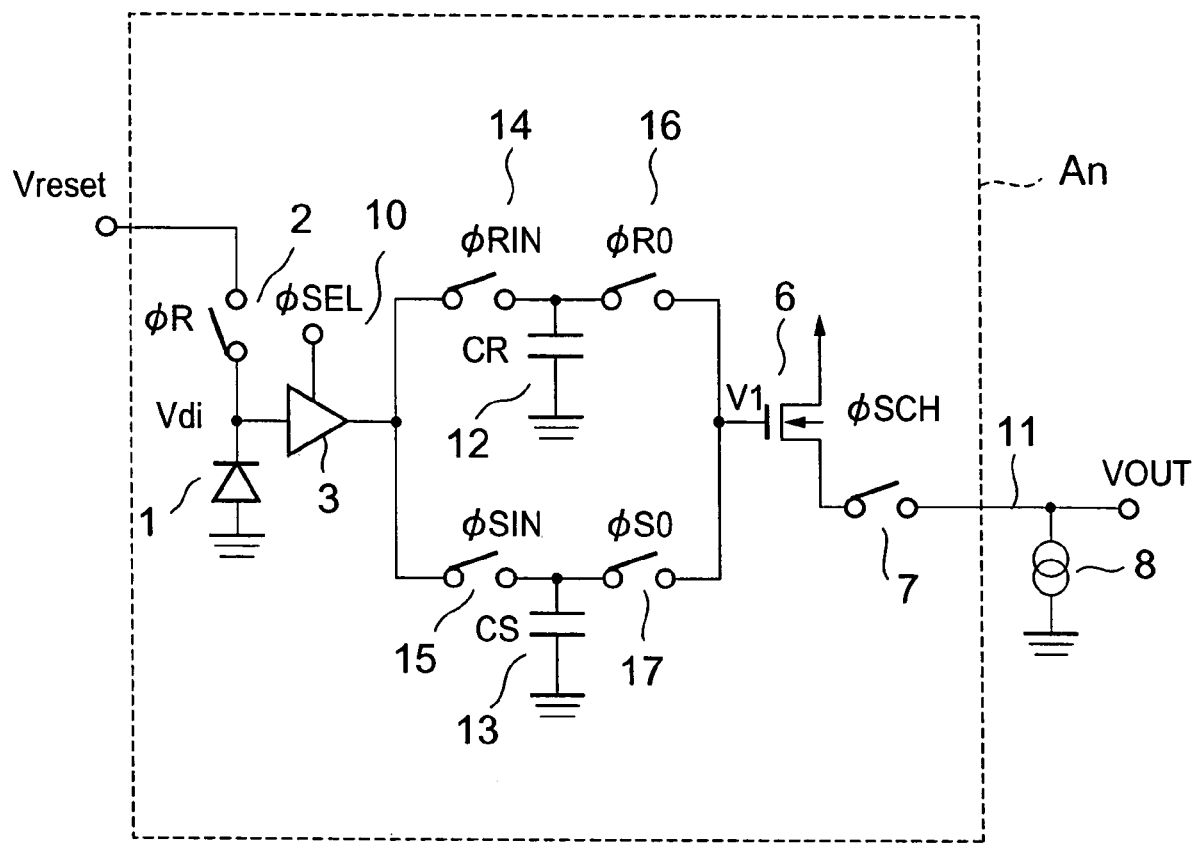
FIG. 14 is a schematic circuit diagram of a photoelectric converter according to the fourth embodiment of the present invention.

FIG. 14 is a schematic circuit diagram of a photoelectric converter according to the fourth embodiment of the present invention. A point of difference of the photoelectric converter of this embodiment from the photoelectric converter of the second embodiment shown in FIG. 10 is that the terminal Vreset is provided outside the area of the photoelectric converter. The number of sets of constituent elements provided inside a frame of a photoelectric conversion block An shown in FIG. 14 is identical to the number of pixels. A channel selection switch 7 of each block is connected to a common signal line 11. Note that the photoelectric conversion block An shows a photoelectric conversion block of an n-th bit.

Figure 15:
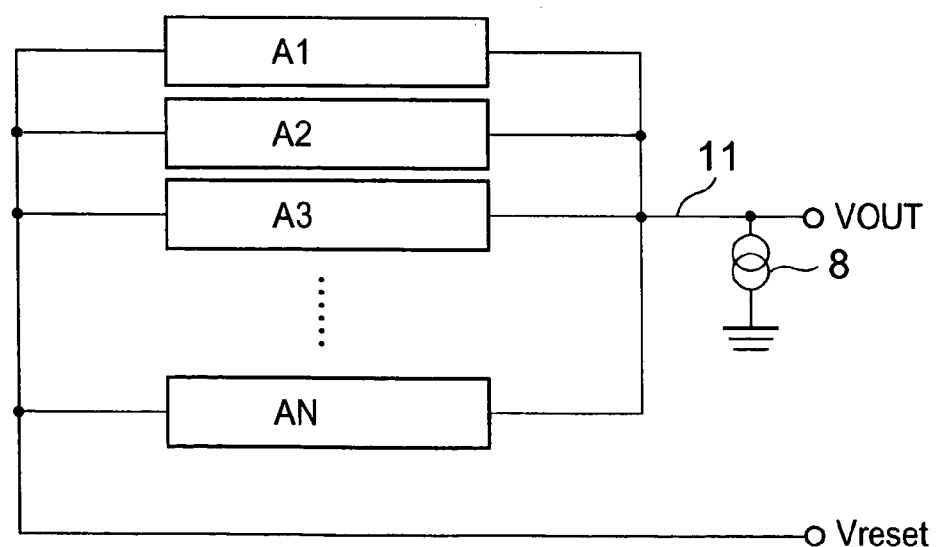
FIG. 15 is a circuit diagram, partly in block diagram, of an entire configuration of the photoelectric converter according to the fourth embodiment of the present invention.

FIG. 15 is a circuit diagram showing a configuration of the photoelectric converter according to the fourth embodiment of the present invention.

The circuit includes: a photodiode 1 serving as a photoelectric conversion unit; transfer switches 14, 15, 16, and 17 serving as an electric charge transfer unit; a reset switch 2 serving as a reset unit; an amplification unit 3; a capacitor 13 for holding an optical signal; a capacitor 12 for holding a reference signal that is a reference of the photoelectric conversion unit; a MOS transistor 6 constituting a MOS source follower serving as a signal reading unit; a channel selection switch 7 serving as a channel selection unit; the common signal line 11; and a first current source 8.

One terminal of a reset switch 2 is connected to the terminal Vreset. As shown in FIG. 15, the terminal Vreset is common to all the photoelectric converters.

The amplification unit 3 may be constituted by a MOS source follower, a voltage follower amplifier, or the like, and may also be provided with an amplifier enable terminal 10 for selection of an operation state.

An output signal outputted through the output terminal VOUT of this photoelectric converter is inputted to the input terminal VIN of the signal processing circuit of FIG. 1. The photoelectric converter and the signal processing circuit may be formed on one semiconductor substrate.

Figure 16:
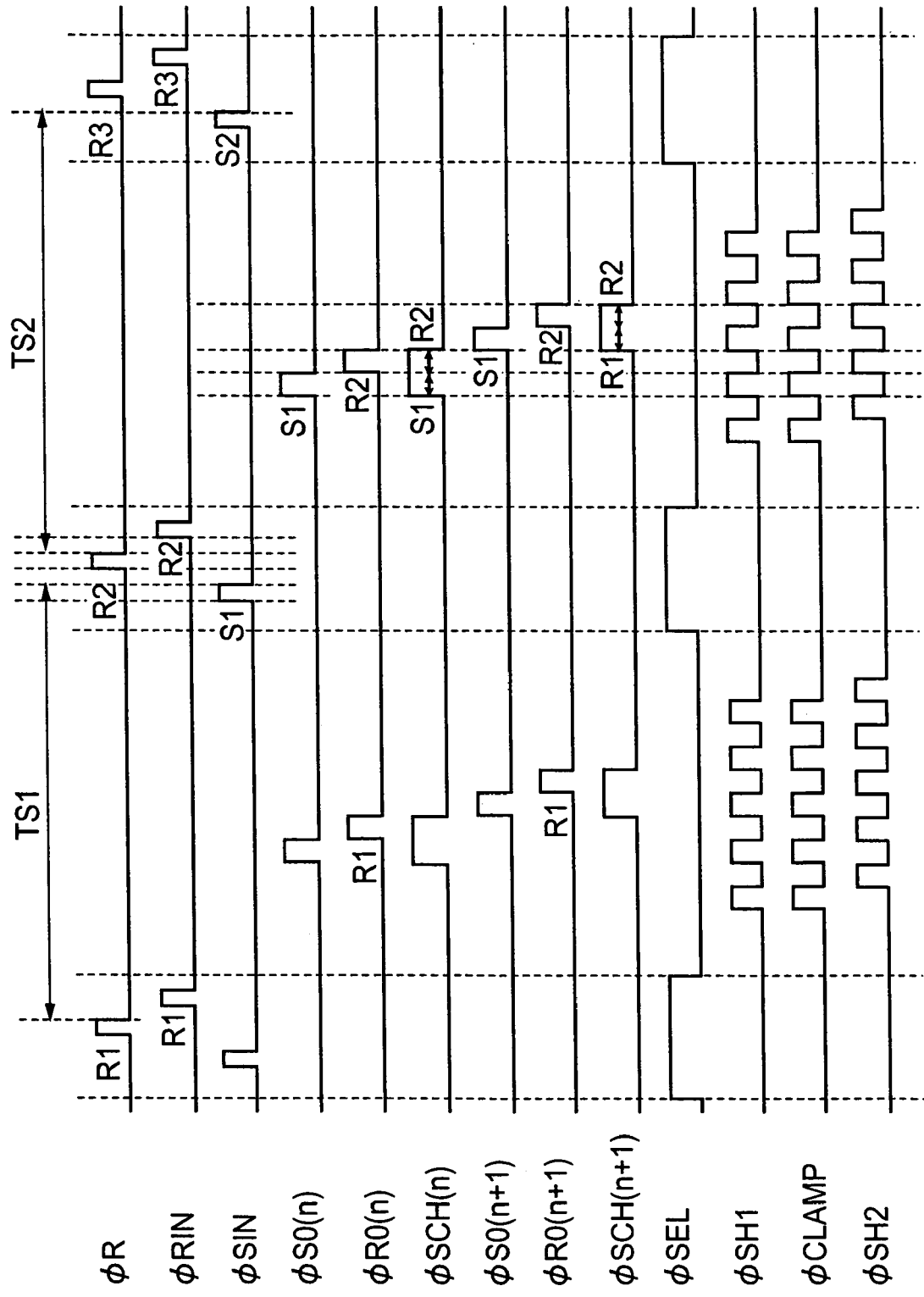
FIG. 16 is a timing chart of the photoelectric converter and the signal processing circuit according to the fourth embodiment of the present invention.

FIG. 16 is a timing chart of the photoelectric converter and the signal processing circuit according to the fourth embodiment of the present invention.

An operation of the photoelectric converter will hereinafter be described with reference to the timing chart shown in. FIG. 16.

φR, φRIN, φSIN, and φSEL of FIG. 16 simultaneously operate for all bits. Since operation timings of φS0, φR0, and φSCH vary depending on bits, φS0, φR0, and φSCH are denoted in the form of addition of "(n)".

First of all, an operation of a photoelectric conversion block of an n-th bit will hereinafter be described.

The transfer switch 15 is turned ON in accordance with a pulse Si of φSIN to read out the optical signal obtained by storing electric charges generated due to incidence of light to the photodiode 1 to the capacitor 13. Next, at the time when the reset switch 2 is turned ON in accordance with a pulse R2 of φR, an output voltage appearing at an output terminal Vdi of the photodiode 1 is fixed to a reference voltage Vreset. On the other hand, at the time when the reset switch 2 is turned OFF, the output voltage appearing at the output terminal Vdi takes a value which is obtained by adding an off-noise to the reference voltage Vreset. Here, the reference voltage Vreset is equal to the reference voltage VREF and has a small thermal noise, so that a fluctuation amount of a voltage of the terminal Vdi becomes smaller every time resetting is conducted.

Next, right after the reset switch 2 is turned OFF, the transfer switch 14 is turned ON in accordance with a pulse R2 of φRIN to read out the reference signal after reset of the photodiode 1 to the capacitor 12. Thereafter, the photocharges are accumulated in the photodiode 1, and hence the electric potential appearing at the output terminal Vdi fluctuates in correspondence to a quantity of photocharges. Since a time interval for the storage ranges from a time point at which reading out of the pulse R2 of φR ends up to a time point at which reading out of the pulse S2 of φSIN of the next time interval ends, this time interval for the storage corresponds to a time interval TS2 shown in FIG. 6. Thus, this time interval for the storage is held for all bits.

Next, an operation for reading out a reference signal and an optical signal will hereinafter be described.

During a time interval TS2 for the storage shown in FIG. 16, if at the same time that the channel selection switch 7 is turned ON in accordance with a pulse of φSCH(n), the transfer switch 17 is turned ON in accordance with a pulse of φS0(n), then an optical signal held in the capacitor 13 is read out to the common signal line 11. This time interval corresponds to a pulse width of a pulse Sl of φSCH(n).

This optical signal is a signal accumulated for a time interval TS1, and has as a reference a reset voltage that is reset by the pulse R1 of φR.

Next, at the time when the transfer switch 16 is turned ON in accordance with a pulse of φR0(n), a reference signal held in the capacitor 12 is read out to the common signal line 11. This reference signal is a signal which is reset in accordance with a pulse R2 of φR.

When a difference between the optical signal and the reference signal is taken in the signal processing circuit in a later stage, this results in that a difference between the reset levels of the different pulses of φR is taken. However, since thermal noises of the voltage Vreset are small, it is possible to take out only a voltage difference due to incidence of light.

Next, if after φSCH(n) is turned OFF, a channel selection switch 7 of the next bit is turned ON in accordance with φSCH(n+1), and a transfer switch 17 of the next bit is turned ON in accordance with a pulse of φS0(n+1), then an operation for reading out an optical signal of the next bit is started. All other pulses of an (n+1)-th bit are shifted backwardly from the pulses of the n-th bit by a time interval when φSCH(n+1) is held in a turn-ON state.

In this embodiment, when the photodiode is in storage operation for a time interval TS2, it is possible to read out the optical signal accumulated for a time interval TS1 for the preceding storage. Consequently, LEDs of three colors R, G, and B, can be turned ON in order to read out color image data. For example, for the time interval TS1, the LED of red can be turned ON to read out a red component, for the time interval TS2, the LED of green can be turned ON to read out a green component, and for a time interval next to the time interval TS2, the LED of blue can be turned ON to read out a blue component. In this case, within the time interval TS2, the optical signal of red is read out.

As described above, the optical signal of the n-th bit, the reference signal of the n-th bit, the optical signal of the (n+1)-th bit, and the reference signal of the (n+1)-th bit are outputted in this order through the output terminal VOUT of the common signal line 11. Then, the order of the optical signal and the reference signal is reversed from that in the photoelectric converter 1. However, similarly to the photoelectric converter according to the first embodiment of the present invention, a difference between the optical signal and the reference signal can be amplified in the signal processing circuit of FIG. 1 with the level VREF as a reference using the pulse signals φSH1, φCLAMP, and φSH2 shown in FIG. 16.

In the above description, any circuit may be adopted as the photoelectric converter as long as it is adapted to output a reference signal and an optical signal in order. The signal processing can be executed using a linear sensor or an area sensor. In addition, it is possible to cope with the case where the output order of a reference signal and an optical signal is reversed by inversely connecting the input terminals INP and INM of the subtracter. Also, if the input terminals INP and INM of the subtracter are inversely connected, then the level of the output signal of the subtracter is inverted with the level VREF as a reference. Thus, the sensitivity of the signal processing circuit can be made positive irrespective of the sensitivity of the optical signal being positive or negative.

As described above, according to the present invention, the same offset voltage is contained in the output signal of the subtracter for the time interval of the first half, and the output signal of the subtracter for the time interval of the second half, and a difference between the output signal of the subtracter for the time interval of the first half, and the output signal of the subtracter for the time interval of the second half is taken by the voltage clamp circuit. Thus, it is possible to take out a signal in which the offsets of the subtracter cancel each other with the reference voltage as a reference. Consequently, it is possible to obtain the photoelectric converter having merely a small fixed pattern noise. In addition, it is possible to form a linear image sensor IC or an area image sensor IC in which the photoelectric conversion unit and the signal processing circuit are formed on one semiconductor substrate.

In addition, if a plurality of linear image sensor ICs are mounted as shown in FIG. 13, and the reset voltages to be supplied to the respective image sensor ICs are made common, then the reset voltages of the photodiodes of all the image sensor ICs become identical to one another. As a result, it is possible to reduce fluctuation in sensitivity among ICs. In addition, in accordance with this embodiment, since the reset voltage for light receiving elements can be supplied from the outside through the terminal VREF, it is possible to supply a stable voltage small in thermal noises. Consequently, it is possible to solve the above-mentioned problem that streaks are formed in the read-out image.

In addition, a capacitor 48 having a large capacity is provided between the common reference voltage terminal and GND or the like to further reduce the thermal noises of the reset noise to thereby allow a more stable read-out image to be obtained.

It is preferable that the capacity of the capacitor 48 is set equal to or larger than 0.01 ιF, and the reset voltage supplied through the terminal VREF is set so as to fall within a range of 1 V to a voltage lower than the power supply voltage by about 1 V.

In the above description of the close contact type image sensor according to the fourth embodiment of the present invention, the signal processing circuit 42 may not be self-contained in the IC.

Fifth Embodiment

Figure 17:
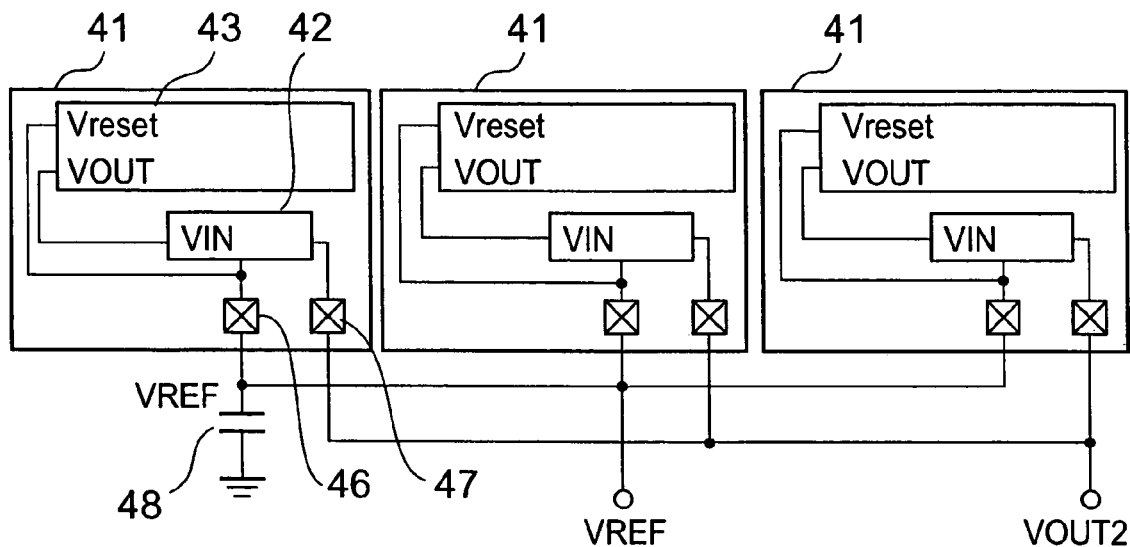
FIG. 17 is a schematic diagram of a close contact type image sensor according to a fifth embodiment of the present invention.

FIG. 17 is a schematic diagram of a close contact type image sensor according to a fifth embodiment of the present invention. A point of difference of this embodiment from the fourth embodiment is that the reference voltage VREF for the signal processing circuit 42 is made common to the reset voltage for the light receiving element. At this time, while the reset voltage for the light receiving element cannot be freely set, this is no problem in terms of practical use since the reference voltage VREF for the signal processing circuit 42 is normally about 1 V.

As a result, the number of kinds of reference voltage supplied from the outside of the IC can be made one, and the thermal noises of the reference voltage of the signal processing circuit 42 can also be reduced while enhancing stability of the reference voltage of the signal processing circuit 42. As a result, it is also possible to reduce the noise contained in the signal processing circuit 42.

Sixth Embodiment

Figure 18:
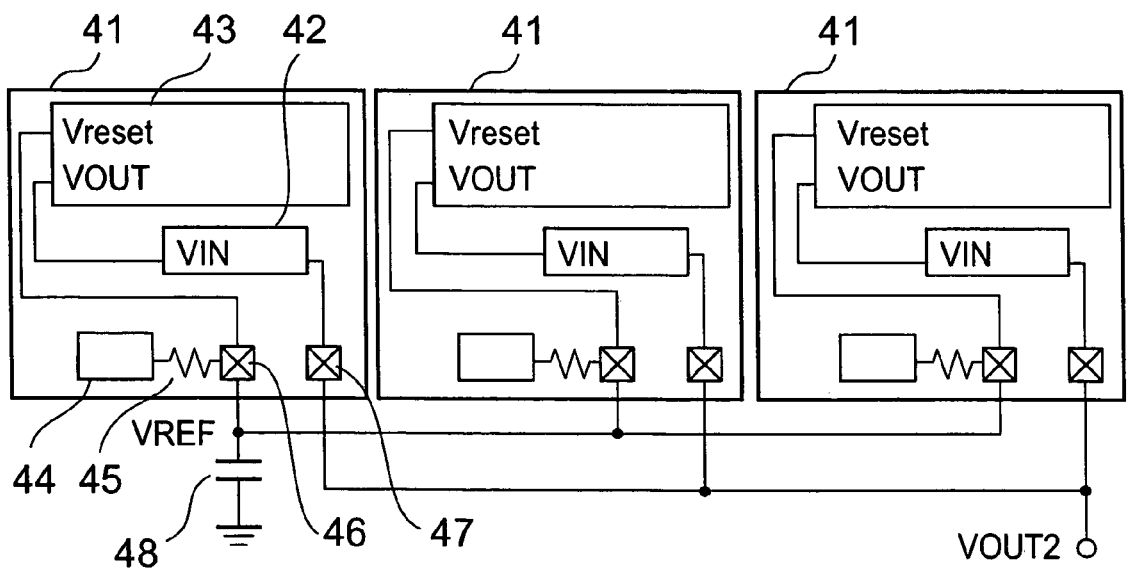
FIG. 18 is a schematic diagram of a close contact type image sensor according to a sixth embodiment of the present invention.
Figures 19, 20:
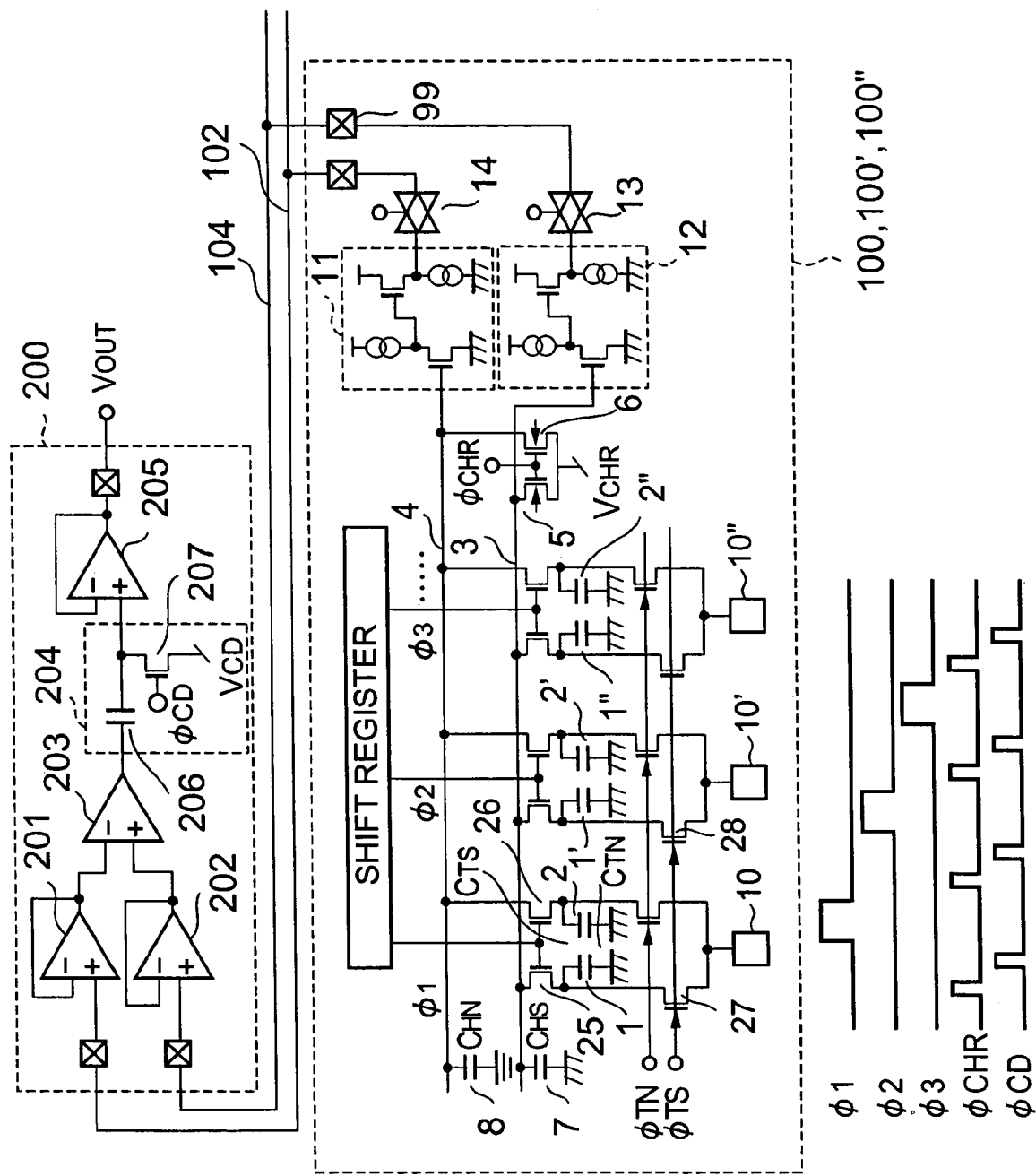
FIG. 19 is a circuit diagram of an image sensor of Related Art Example 1.
FIG. 20 is a timing chart of the image sensor of Related Art Example 1.
Figure 21:
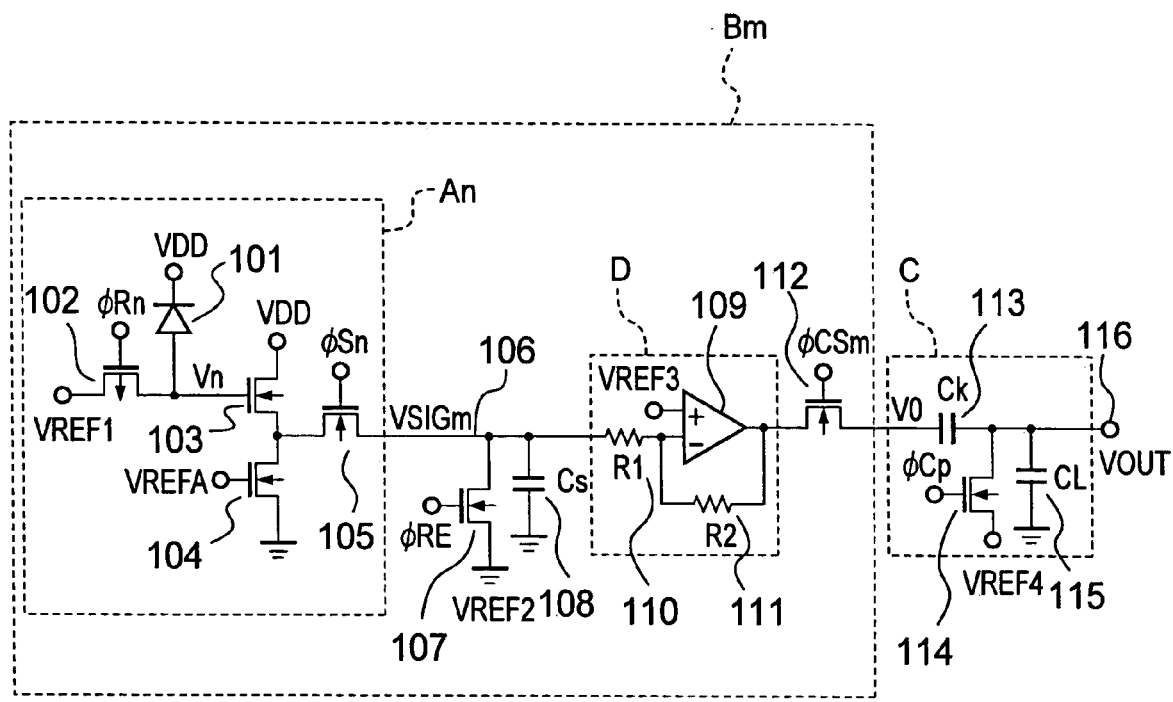
FIG. 21 is a circuit diagram of an image sensor of Related Art Example 2.

FIG. 18 is a schematic diagram of a close contact type image sensor according to a sixth embodiment of the present invention. A point of difference of this embodiment from the fourth embodiment is that in the inside of each image sensor IC 41, the reference voltage circuit 44 is provided, and also the resistor 45 is provided between the output terminal of the reference voltage circuit 44 and the reference voltage terminal 46. A resistance value of the resistor 45 is set to about 1 KΩ.

In the image sensor configured as shown in FIG. 18, the reference voltage VREF gets a mean value of the reference voltages generated by the reference voltage circuits 44 provided inside the image sensor ICs 41, respectively. Consequently, the reset voltages of all the image sensor ICs 41 can be made identical to one another, and hence it is possible to obtain the same effects as those inherent in the close contact type image sensor according to the fourth embodiment of the present invention. Moreover, since there is no need to supply the reference voltage from the outside, the image sensor of this embodiment is easy to use.

In addition, while not illustrated, in the configuration of FIG. 18, the reference voltage VREF of the signal processing circuit 42 may also be made common to the reset voltage of the light receiving element. In this case, it is possible to obtain the same effects as those inherent in the close contact type image sensor according to the fifth embodiment of the present invention. Moreover, since there is no need to supply the reference voltage from the outside, the image sensor of this embodiment is easy to use.

In the above description, the present invention is not intended to be limited to the above-mentioned preferred embodiments, and hence various changes may be made to be implemented without departing from the subject matter of the invention.

What is claimed is:

1. A signal processing circuit comprising:
   a sample/hold circuit that samples an input signal comprised of a first signal and a second signal and for holding the first signal, the first signal comprising an optical signal obtained due to storage of electric charges generated due to light incident upon a photoelectric converter, and the second signal comprising a reference signal obtained due to resetting of the photoelectric converter;
   a subtracter connected to receive an output signal of the sample/hold circuit and the input signal and for obtaining a difference between the output signal of the sample/hold circuit and the input signal; and
   a voltage clamp circuit for clamping a part or all of an output signal from the subtracter.

2. A signal processing circuit according to claim 1; wherein the sample/hold circuit comprises a first sample/hold circuit; and further comprising a second sample/hold circuit connected to an output of the voltage clamp circuit for sampling an output signal of the voltage clamp circuit when the first sample/hold circuit holds the first signal.

3. A signal processing circuit according to claim 1; wherein the subtracter is a differential amplifier comprised of an operational amplifier and a plurality of resistors; and wherein a reference voltage of the differential amplifier and a clamping voltage of the voltage clamp circuit are common to each other.

4. An image sensor IC comprising: a signal processing circuit as claimed in claim 1 formed together with the photoelectric converter on one semiconductor substrate.

5. An image sensor comprising: a plurality of image sensor ICs as claimed in claim 4.

6. An image sensor IC comprising:
   a photoelectric converter;
   a signal processing circuit connected to an output terminal of the photoelectric converter, the signal processing circuit comprising a sample/hold circuit for sampling an input signal comprised of an optical signal and a reference signal and for holding the optical signal, a subtracter connected to receive the output signal of the sample/hold circuit and the input signal and for obtaining a difference between the output signal of the sample/hold circuit and the input signal, and a voltage clamp circuit for clamping an output signal of the subtracter, the optical signal being obtained due to storage of electric charges generated due to light incident upon the photoelectric converter, and the second signal comprising a reference signal obtained due to resetting of the photoelectric converter;
   a signal output terminal connected to an output terminal of the signal processing circuit;
   a reference voltage terminal connected to a terminal at which a reference voltage for the signal processing circuit appears;
   a reference voltage circuit; and
   a resistor disposed between the reference voltage circuit and the reference voltage.

7. A close contact type image sensor comprising: a plurality of image sensor ICs according to claim 6, the reference voltage terminals of the respective image sensor ICs being electrically connected to one another.

8. An image sensor IC according to claim 6; further comprising a gain amplifier for amplifying the output signal clamped by the voltage clamp circuit, a reference voltage for the gain amplifier being supplied through the reference voltage terminal.

9. A signal processing method, comprising the steps of:
   generating an input signal comprised of an optical signal component obtained due to storage of electric charges generated due to light incident upon a photoelectric converter and a reference signal component obtained due to resetting of the photoelectric converter;
   sampling the input signal and holding the optical signal component of the input signal using a sample/hold circuit;
   obtaining a difference between an output signal of the sample/hold circuit and the input signal using a subtracter; and
   clamping a part or all of an output signal from the subtracter using a voltage clamp circuit.

10. A signal processing method according to claim 9; further comprising the steps of amplifying the input signal and an output signal from the sample/hold circuit, and inputting the amplified input and output signals to the subtracter.

11. A signal processing method according to claim 9; wherein the sample/hold circuit comprises a first sample/hold circuit; and further comprising the step of sampling an output signal from the voltage clamp circuit using a second sample/hold circuit when the first sample/hold circuit holds the optical signal component.

* * * * *